US005654017A

United States Patent [19]
Harmsen

[11] Patent Number: 5,654,017
[45] Date of Patent: Aug. 5, 1997

[54] MODULAR MOLDING APPARATUS

[75] Inventor: Wilhelmus Hendrikus Johannes Harmsen, Wehl, Netherlands

[73] Assignee: Fico B.V., Didam, Netherlands

[21] Appl. No.: 558,438

[22] Filed: Nov. 16, 1995

[30] Foreign Application Priority Data

Nov. 18, 1994 [NL] Netherlands ............ 94.01930

[51] Int. Cl.⁶ ............ B29C 45/02; B29C 45/14; B29C 45/17
[52] U.S. Cl. ............ 425/116; 425/121; 425/126.1; 425/227; 425/544; 425/556; 425/588; 425/436 R; 425/DIG. 201; 264/272.17
[58] Field of Search ............ 264/272.1; 425/116, 425/121, 126.1, 544, 556, 588, 226, 225, 227, 436 R, 436 RM, DIG. 201, DIG. 228

[56] References Cited

U.S. PATENT DOCUMENTS

| | | |
|---|---|---|
| 4,362,486 | 12/1982 | Davis et al. ............ 425/126.1 |
| 4,580,964 | 4/1986 | Repella . |
| 4,812,114 | 3/1989 | Kennon et al. ............ 425/116 |
| 4,872,825 | 10/1989 | Ross ............ 425/126.1 |
| 4,997,355 | 3/1991 | Yamauchi et al. . |
| 5,297,897 | 3/1994 | Venrooij et al. ............ 425/116 |
| 5,358,398 | 10/1994 | Brown et al. ............ 425/DIG. 201 |

FOREIGN PATENT DOCUMENTS

| | | |
|---|---|---|
| 0428792 | 5/1991 | European Pat. Off. . |
| 9201834.3 | 7/1992 | Germany . |
| 62-70009 | 3/1987 | Japan ............ 425/121 |

Primary Examiner—Khanh P. Nguyen
Attorney, Agent, or Firm—Webb, Ziesenheim, Bruening, Logsdon, Orkin & Hanson P.C.

[57] ABSTRACT

An apparatus is provided for molding lead frames. The apparatus has a mold formed by two mold halves. An assembly for introducing a lead frame into one of the mold halves, an assembly for carrying encapsulating material into the cavities of the mold and an assembly for removing an encapsulated product from the mold are arranged on a carriage movable along a guide relative to the mold halves.

19 Claims, 4 Drawing Sheets

MODULAR MOLDING APPARATUS

BACKGROUND OF THE INVENTION

The present invention relates to an apparatus for molding lead frames including at least one mould formed by two mould halves movable relative to one another, means for introducing a lead frame into one of the mold halves, means for carrying encapsulating material into the cavities of the mold, means for exerting pressure in these cavities, means for heating the mold halves, means for cleaning the mold halves and means for removing an encapsulated product from the mold.

DESCRIPTION OF THE PRIOR ART

Such apparatus is already known and is described for instance in the European patent application 892030-03.2 of the same applicant as the present case. Such a molding apparatus combines a simple structure with a relatively high production speed. A drawback to this molding apparatus is that over a period of time the capacity thereof cannot be adapted to changing requirements. Another drawback is that when one component of the molding apparatus malfunctions the entire molding apparatus ceases to function. The susceptibility to malfunction is required to be exceptionally low and considerable effort must be made with existing apparatus to comply with this requirement. In addition, the molding apparatus is wholly idle during switch-over to a different product.

The present invention has for its object to provide a molding apparatus which is less susceptible to malfunction during use, which can be adjusted to another product with minimum loss of productivity, and the capacity of which can be adapted to changing requirements. A following objective is to provide a molding apparatus which can be coupled to processing units, e.g. for further processing or controlling the quality of an encapsulated product.

SUMMARY OF THE INVENTION

The present invention provides for this purpose a molding apparatus of the type stated in the background wherein the means for introducing a lead frame into one of the mold halves, the means for carrying encapsulating material in the cavities of the mold the means for removing an encapsulated product from the mold are arranged on at least one carriage movable along a guide relative to the mold halves, which carriage provided with means serves at least one mold. The movable cartridge makes it possible to transport a lead frame for encapsulating to a mold which is at that moment available to perform the encapsulating operation. The feed means and the means for removing encapsulated product can of course also be arranged on carriages which are movable independently of each other. Any possibly non-functioning molds of a molding apparatus with a plurality of molds are not used herein for encapsulating; such a molding apparatus is hereby less susceptible to malfunction. When for instance one mold is not functioning due to a problem, it is possible to carry on production with the remaining molds. It is also possible to adjust one or more molds, wherein other molds carry on production at the same time.

A preferred embodiment is characterized in that the guide length is variable by disconnecting and connecting guide parts. By varying the length it becomes possible to vary the capacity of the apparatus to changing requirements over a period of time. It is thus possible to acquire an apparatus of comparatively limited capacity to manufacture a new product and, if the product is found to be a success, to then increase the capacity of the apparatus by lengthening the guide and adding at least one extra mold.

Another preferred embodiment is characterized in that the carriage also includes a means for cleaning the mold halves. It is thus possible prior to loading of lead frames or after removal of the encapsulated products to clean the mold halves without a separate cleaning unit being required for each separate mold.

The carriage preferably co-acts with a lead frame loading unit for supplying lead frames to the carriage. Such a lead frame loading unit is then preferably equipped to take lead frames out of a cassette. Another preferred embodiment of the molding apparatus is characterized in that the carriage preferably co-acts with an encapsulating material loading unit for supplying encapsulating material to the carriage. Using these loading units the carriage can be loaded without human labor being required for this purpose. In a preferred embodiment it is even possible to place in or against the loading unit a cassette used for transport of the lead frames, whereafter the loading unit takes the lead frames out of this cassette without further human intervention being required for this purpose, The chance of errors and the danger of damage to the lead frames is hereby limited.

Another preferred embodiment is characterized in that the carriage co-acts with a. discharge unit for taking encapsulated product from the carriage. This discharge unit is preferably equipped to plate the encapsulated product into a cassette. The above stated advantages of a loading unit are equally valid for a discharge unit; i.e. without human intervention and with little chance of errors or damage it is possible to remove the encapsulated products from the carriage and, in a recommended situation, to place the products in a cassette.

The number of molds to be served by the carriage can be increased or reduced as desired. Subject to the capacity requirement it is possible to incorporate additional molds in the molding apparatus or to remove molds from the molding apparatus in order thus to increase or decrease the maximum capacity of the molding apparatus. A molding apparatus can thus be adapted for instance to a growing demand for capacity. For molding products wherein particularly high standards apply in respect of susceptibility to malfunction of the molding apparatus, it is also possible to place an additional one or more molds in the molding apparatus. If one or more molds then cease production due to malfunction, the total molding apparatus will still provide the required maximum capacity.

The carriage preferably also serves a device for processing encapsulated product. Due to this extra function of the carriage it is possible to couple the molding apparatus mechanically to a follow-on process such as for instance trimming the encapsulated products and subsequent bending of the leads. It is also possible however to allow a processing of the encapsulated products to take place before they are placed in a magazine. Here can be envisaged for example a so-called dogate process and/or punching process. These processes are intended to remove excess epoxy. A quite different possibility is the addition of a process for controlling the quality of the encapsulated product. In this linking of a number of processing units it is recommended to place the processing units as closely as possible to each other. Transporting distances are hereby minimized, whereby the required transport time is also minimized. It is however possible in specific situations to place the processing units further apart; the guide along which the carriage moves will hereby be extra-long. The advantages of a fixed sequence of different production processes can thus be realized in comparatively very simple manner using this invention. It is also possible to provide with extra functionality an unloading or loading unit situated on a carriage.

BRIEF DESCRIPTION OF THE DRAWING

The present invention will be further elucidated with reference to the non-limitative embodiments shown in the following figures, wherein.

DETAILED DESCRIPTION OF THE PREFERRED EMBODIMENT

Figure 1:
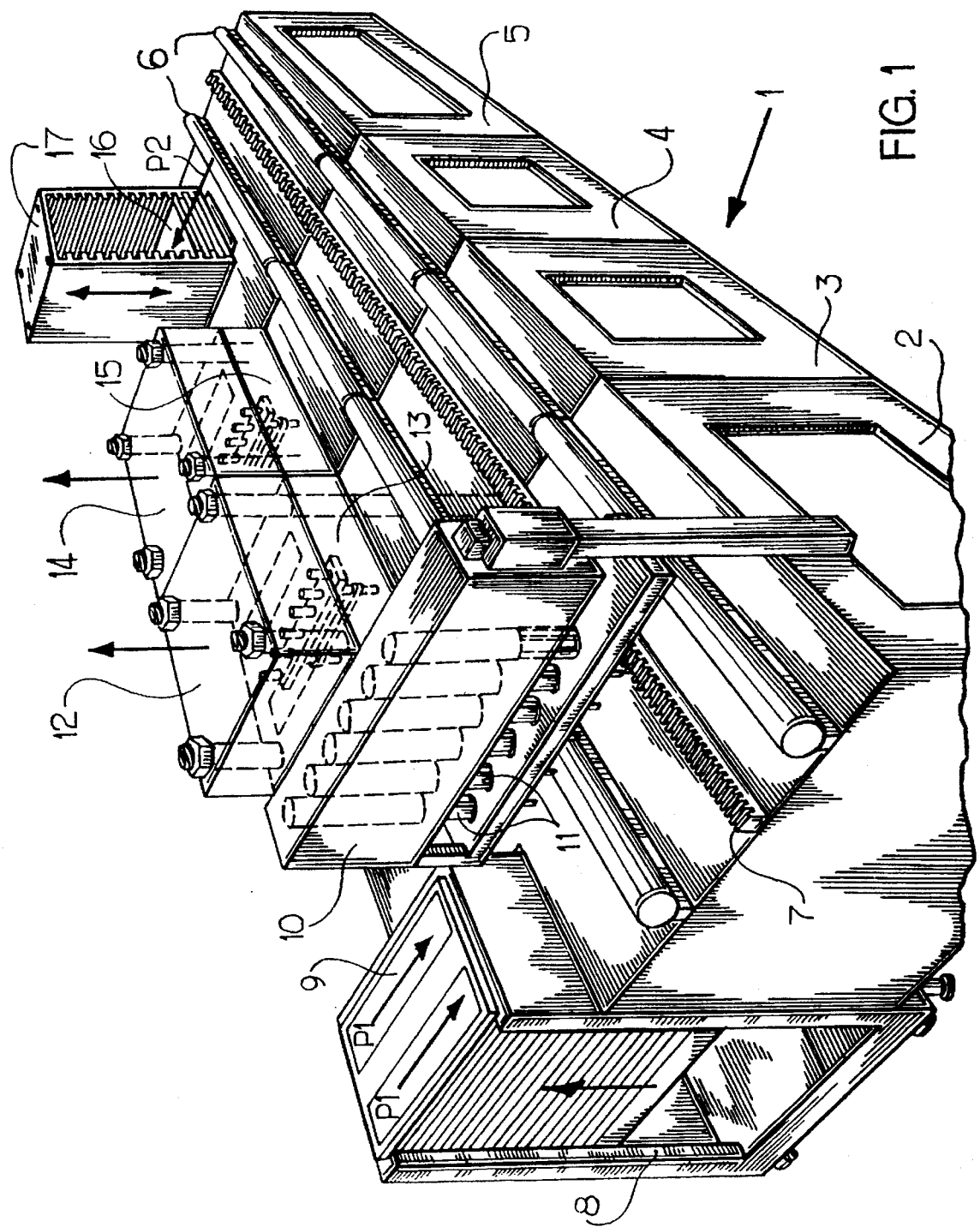
FIG. 1 shows a perspective view of a molding apparatus according to the present invention without carriage.

FIG. 1 shows a moulding apparatus 1 with a loading unit 2, two mold units 3, 4 and a discharge unit 5. A carriage not shown in this figure is movable along a guide 6 by engagement of for instance a toothed wheel on a toothed path 7. A cassette 8 in which lead frames 9 are arranged is placed against the loading unit 2. Lead frames 9 are supplied as according to arrows P1 to a carriage when this latter is situated at a position adjacently of cassette 8. An encapsulating material feed device 10 is disposed above the guide 6 to place pellets of encapsulating material 11 on the carriage so that the latter can transport them further to the mold units 4. After the carriage provided with pellets 11 and lead frames 9 has been displaced to one of the mold units 3, 4, the carriage places the lead frames 9 and pellets 11 between the mold halves 12, 13, respectively 14, 15. The encapsulating process then takes place, whereafter the carriage removes encapsulated products 16 from between the mold halves 12, 13, respectively 14, 15 and transports them to the discharge unit 5. In this discharge unit 5 the encapsulated product 16 is placed from the carriages into an at least partially empty cassette 17 as according to arrow P2.

Figure 2:
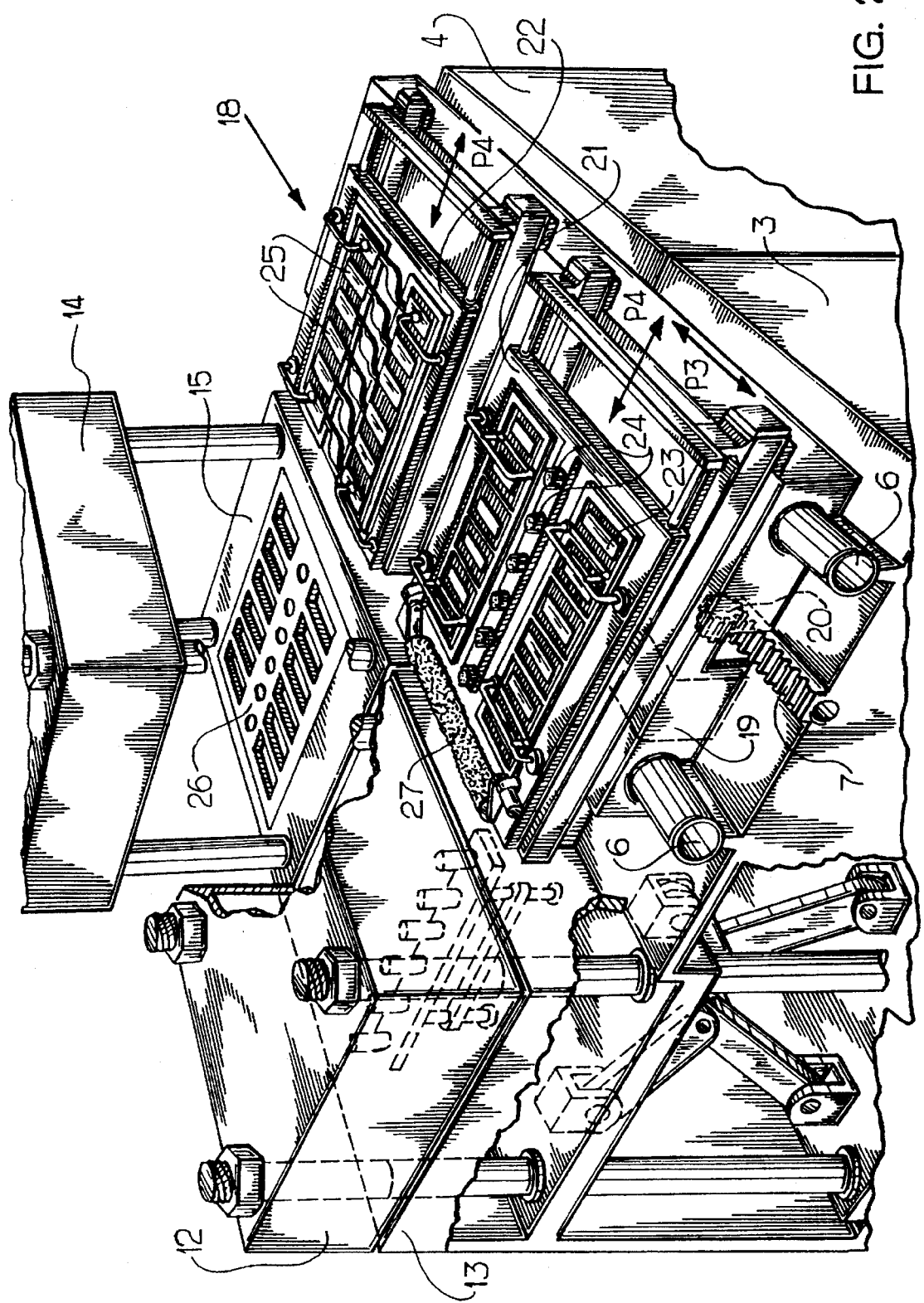
FIG. 2 shows a partly cut away perspective view of a part of the apparatus shown in FIG. 1 with carriage.

FIG. 2 shows a view of a part of the molding apparatus 1 of FIG. 1. This figure also shows a carriage 18 which is displaceable along the guide 6 as according to arrow P3 in that a toothed wheel 20 driven by a drive 19 engages onto the toothed path 7. Situated on carriage 18 are two carriers 21, 22 displaceable as according to arrow P4 relative to carriage 18. The one carrier 21 is equipped for feeding lead frames 23 and pellets of encapsulating material 24, while the other carrier 22 is equipped to discharge the encapsulated product 25. The mold unit 3 is situated in closed position, i.e. the mold halves 12, 13 are clamped against each other. The mold unit 4 on the other hand is situated in opened position, i.e. the mold halves 14, 15 are located at a mutual distance. An underside 26 of a mold is hereby clearly visible. For a further description of the operation of the mold units 3, 4, reference is made to for instance the patent publication mentioned in the background. The carrier 21 is also provided with cleaning means 27 with which the mold halves can be cleaned after an encapsulating operation has taken place.

Figure 3:
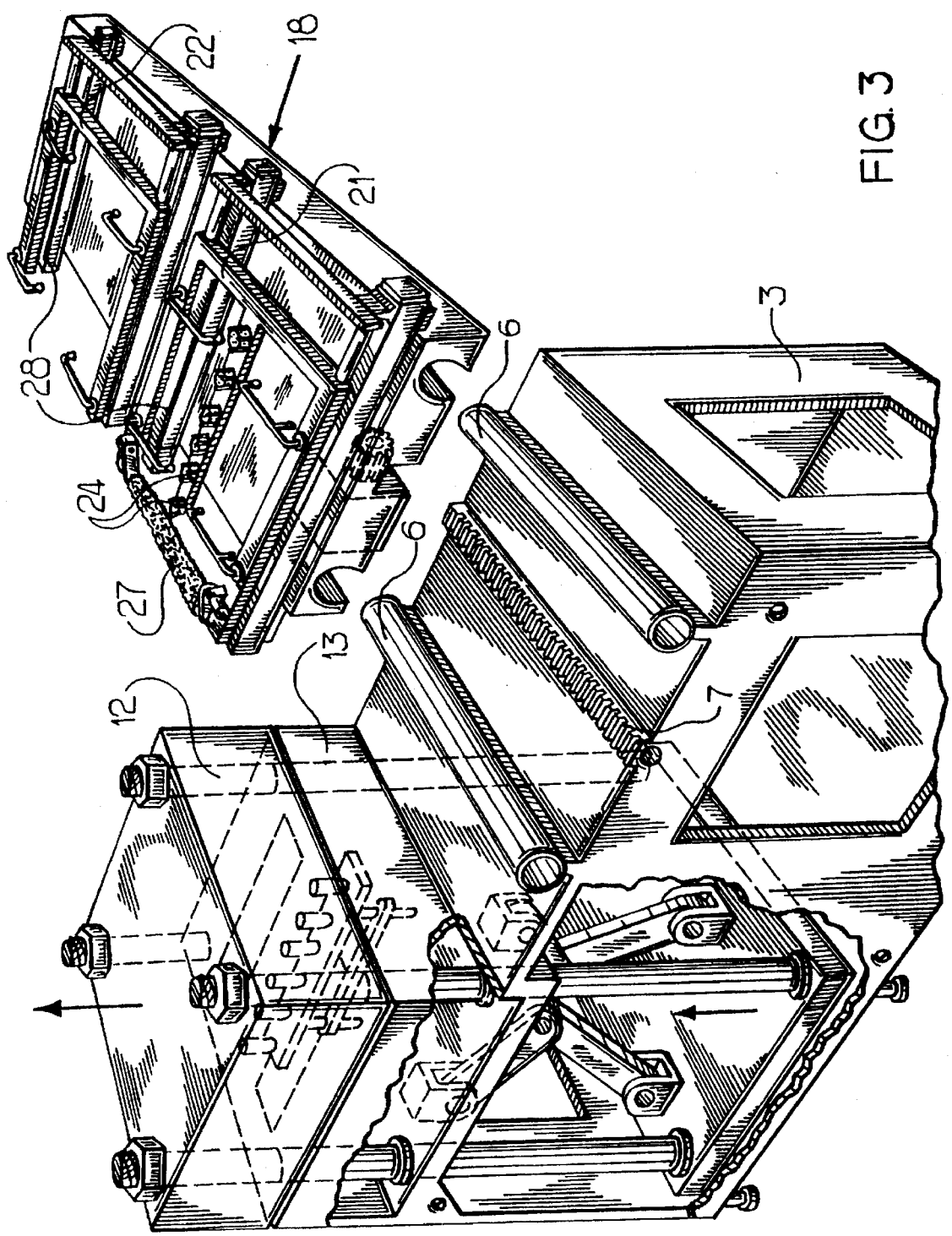
FIG. 3 shows a perspective view of a partly cut away mold and a carriage illustrated separately.

FIG. 3 shows the carriage 18 without lead frames or encapsulated products. It can hereby be seen more clearly than in the foregoing figure that the carriers 21, 22 are displaceable along guides 28 in a manner such that they can be situated wholly between mold halves 12, 13.

Figure 4:
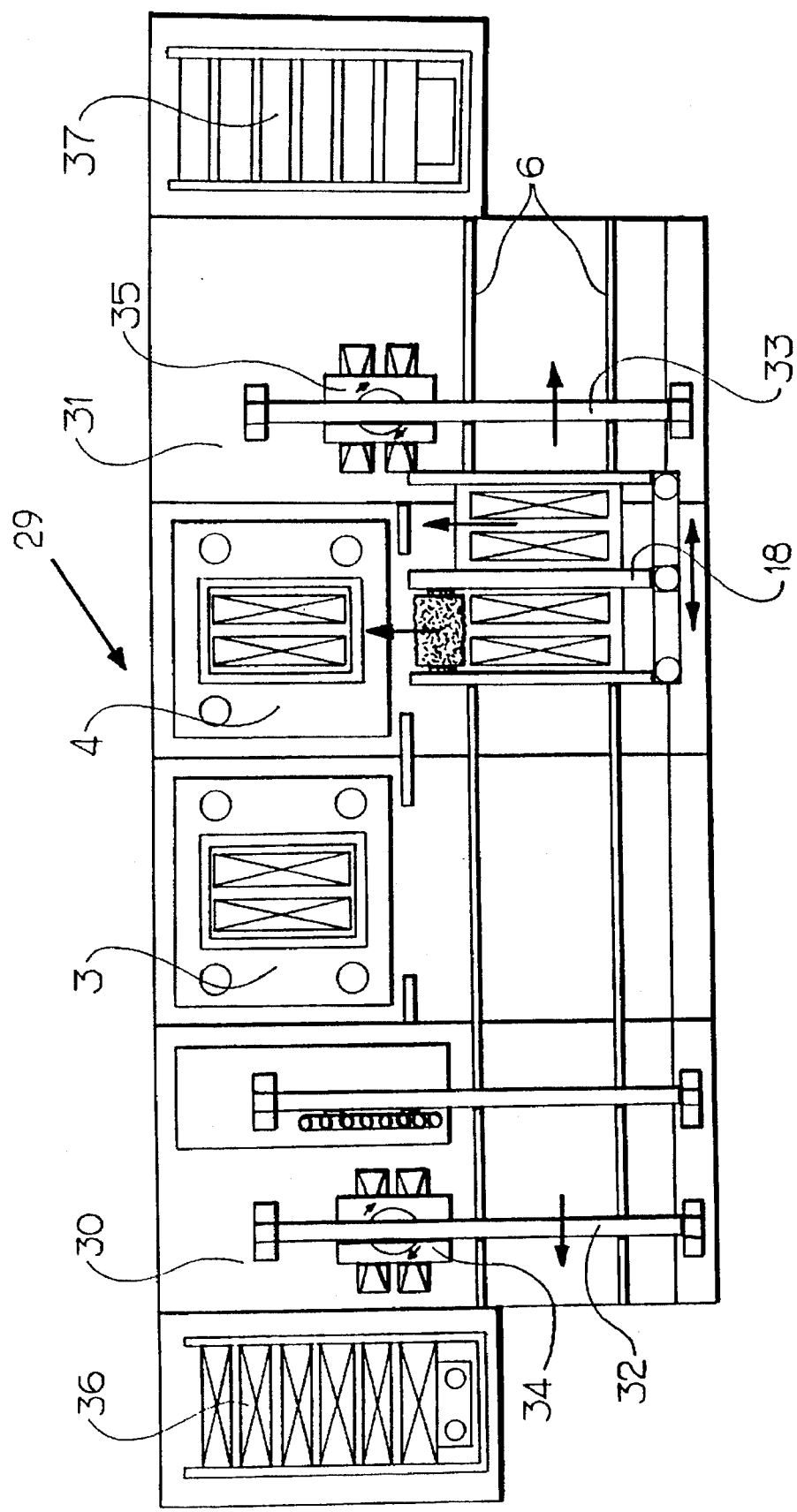
FIG. 4 shows a top view of an alternative embodiment of the molding apparatus according to the invention.

Finally, FIG. 4 shows a schematic top view of an alternatively embodied molding apparatus 29. The mold units 3, 4 correspond with the foregoing figures but a loading unit S0 and a discharge unit 31 differ from that already shown. Grippers 34, 35 displaceable along guides 32, 33 are accommodated in loading unit 30 and discharge unit 31. These grippers 34, 35 co-act with cassettes 36, 37 respectively. The change relative to the molding apparatus 1 shown in the foregoing figures is therefore that the carriage 18 does not co-act directly with cassettes 36, 37 but that grippers displaceable between both of these are arranged. This may have the advantage for instance that co-action can take place between cassettes 36, 37 of a variety of sizes.

I claim:
1. An apparatus for molding lead frames, comprising:
at least one mold having cavities, with the mold formed by two mold halves movable relative to one another;
means for introducing a lead frame into one of the mold halves;
means for carrying encapsulating material into the cavities of the at least one mold;
means for exerting pressure in the cavities; of the at least one mold;
means for heating the mold halves;
means for cleaning the mold halves;
means for removing an encapsulated product from the at least one mold;
a guide located adjacent the at least one mold; and
at least one carriage movable along the guide relative to the mold halves,
wherein the means for introducing a lead frame into one of the mold halves, the means for carrying encapsulating material into the cavities of the at least one mold and the means for removing an encapsulated product from the at least one mold are arranged on the at least one carriage.

2. The molding apparatus as claimed in claim 1, wherein the guide includes a plurality of guide parts and the length of the guide is variable by adding and removing guide parts.

3. The molding apparatus as claimed in claim 1, wherein the carriage includes the means for cleaning the mold halves.

4. The molding apparatus as claimed in claim 1, including a lead frame loading unit for supplying lead frames to the carriage.

5. The molding apparatus as claimed in claim 4, including a cassette, with the lead frame loading unit configured to take lead frames out of the cassette.

6. The molding apparatus as claimed in claim 1, including an encapsulating material loading unit configured to supply encapsulating material to the carriage.

7. The molding apparatus as claimed in claim 1, including a discharge unit configured to take the encapsulated product from the carriage.

8. The molding apparatus as claimed in claim 7, including a cassette, with the discharge unit configured to place the encapsulated product into the cassette.

9. The molding apparatus as claimed in claim 1, wherein a number of molds to be served by the carriage can be increased or reduced.

10. The molding apparatus as claimed in claim 1, including an apparatus for processing encapsulated product, with the carriage configured to move the encapsulated product to the apparatus for processing encapsulated product.

11. The molding apparatus as claimed in claim 2, wherein the carriage includes the means for cleaning the mold halves.

12. The molding apparatus as claimed in claim 2, including a lead frame loading unit for supplying lead frames to the carriage.

13. The molding apparatus as claimed in claim 12, including a cassette, with the lead frame loading unit configured to take lead frames out of the cassette.

14. The molding apparatus as claimed in claim 13, including an encapsulating material loading unit configured to supply encapsulating material to the carriage.

15. The molding apparatus as claimed in claim 14, including a discharge unit configured to take the encapsulated product from the carriage.

16. The molding apparatus as claimed in claim 15, including a second cassette, with the discharge unit configured to place the encapsulated product into the second cassette.

17. The molding apparatus as claimed in claim 16, wherein a number of molds to be served by the carriage can be increased or reduced.

18. An apparatus for forming encapsulated lead frames, comprising:

at least one mold, with the at least one mold including two mold halves movable relative to one another;

means for introducing a lead frame into one of the mold halves;

means for introducing an encapsulating material into the at least one mold;

means for removing an encapsulated product from the at least one mold;

a guide located adjacent the at least one mold; and at least one carriage movable along the guide relative to the mold halves, wherein the means for introducing the lead frame, the means for introducing the encapsulating material and the means for removing the encapsulated product are arranged on the at least one carriage.

19. The apparatus as claimed in claim 18, including a plurality of molds, with the guide extending adjacent each mold such that the carriage can be placed adjacent each mold of the apparatus.

* * * * *

UNITED STATES PATENT AND TRADEMARK OFFICE
CERTIFICATE OF CORRECTION

PATENT NO. : 5,654,017
DATED : August 5, 1997
INVENTOR(S) : Wilhelmus H. J. Harmsen It is certified that error appears in the above-indentified patent and that said Letters Patent is hereby corrected as shown below:

Column 1 Line 3 after "BACKGROUND OF THE INVENTION" insert on new line --1. Field of the Invention--.

Column 1 Line 15 before "Description of the Prior Art" insert --2.--.

Column 1 Line 44 "in" should read --into--.

Column 1 Line 45 after "mold" insert --and--.

Column 1 Line 49 "cartridge" should read --carriage--.

Column 2 Line 27 "a. discharge" should read --a discharge--.

Column 2 Line 29 "to plate" should read --to place--.

Column 2 Line 43 after "molding" insert --of--.

Column 2 Line 58 "dogate" should read --degate--.

Column 3 Line 7 "DRAWING" should read --DRAWINGS--.

UNITED STATES PATENT AND TRADEMARK OFFICE
CERTIFICATE OF CORRECTION

PATENT NO.  : 5,654,017
DATED       : August 5, 1997
INVENTOR(S) : Wilhelmus H.J. Harmsen It is certified that error appears in the above-indentified patent and that said Letters Patent is hereby corrected as shown below:

```
Column 3 Lines 33-34 "mold units 4" should read
    --mold units 3,4--.

Column 4 Line 3 "loading unit S0" should read
    --loading unit 30--.

Claim 1 Column 4 Lines 23-24 after "cavities;" delete
    --of the at least one mold;--.
```

Signed and Sealed this

Twentieth Day of January, 1998

BRUCE LEHMAN

Attest:

Attesting Officer

Commissioner of Patents and Trademarks